United States Patent
Kwon et al.

(10) Patent No.: US 8,232,984 B2
(45) Date of Patent: Jul. 31, 2012

(54) THIN FILM TRANSISTOR ARRAY PANEL HAVING A DRIVER INSPECTION UNIT AND DISPLAY DEVICE INCLUDING THE SAME

(75) Inventors: Yeong-Keun Kwon, Suson-si (KR); Yun-Hee Kwak, Seoul (KR); Bae-Heuk Yim, Asan-si (KR); Jeong-Il Kim, Asani-si (KR); Bon-Yong Koo, Asan-si (KR); Mi-Sun Lee, Goyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 417 days.

(21) Appl. No.: 12/559,893

(22) Filed: Sep. 15, 2009

(65) Prior Publication Data

US 2010/0295829 A1 Nov. 25, 2010

(30) Foreign Application Priority Data

May 19, 2009 (KR) .................. 10-2009-0043719

(51) Int. Cl.
*G06F 3/038* (2006.01)
(52) U.S. Cl. .......................... 345/205; 245/92
(58) Field of Classification Search .................. None
See application file for complete search history.

(56) References Cited

U.S. PATENT DOCUMENTS

| | | | |
|---|---|---|---|
| 6,909,304 B2 | 6/2005 | Takafuji | |
| 7,145,357 B2 * | 12/2006 | Lee | 324/756.05 |
| 7,663,395 B2 * | 2/2010 | Chang et al. | 324/760.01 |
| 2007/0291214 A1 * | 12/2007 | Jeon | 349/151 |

FOREIGN PATENT DOCUMENTS

| | | |
|---|---|---|
| JP | 2000-275610 | 10/2000 |
| JP | 2001-296507 | 10/2001 |
| JP | 2001-305195 | 10/2001 |
| JP | 2006-003741 | 1/2006 |
| JP | 2007-114124 | 5/2007 |
| KR | 1020060001573 | 1/2006 |
| KR | 1020070040505 | 4/2007 |
| KR | 1020070071702 | 7/2007 |
| KR | 1020070120320 | 12/2007 |
| KR | 1020080062881 | 7/2008 |
| KR | 1020080083960 | 9/2008 |

* cited by examiner

*Primary Examiner* — Jason Olson

(74) *Attorney, Agent, or Firm* — H.C. Park & Associates, PLC

(57) ABSTRACT

The present invention relates to a thin film transistor array panel and a display device including the same. A thin film transistor array panel according to an exemplary embodiment of the present invention includes: a plurality of gate lines; a plurality of pixels respectively connected to the gate lines; a gate driver comprising a plurality of stages connected to each other, the plurality of stages being respectively connected to the plurality of gate lines and applying gate signals to the plurality of gate lines; and a driver inspection unit separated from the gate driver and including at least three inspection stages, wherein each of the at least three inspection stages has a same structure as one of the plurality of stages of the gate driver.

15 Claims, 5 Drawing Sheets

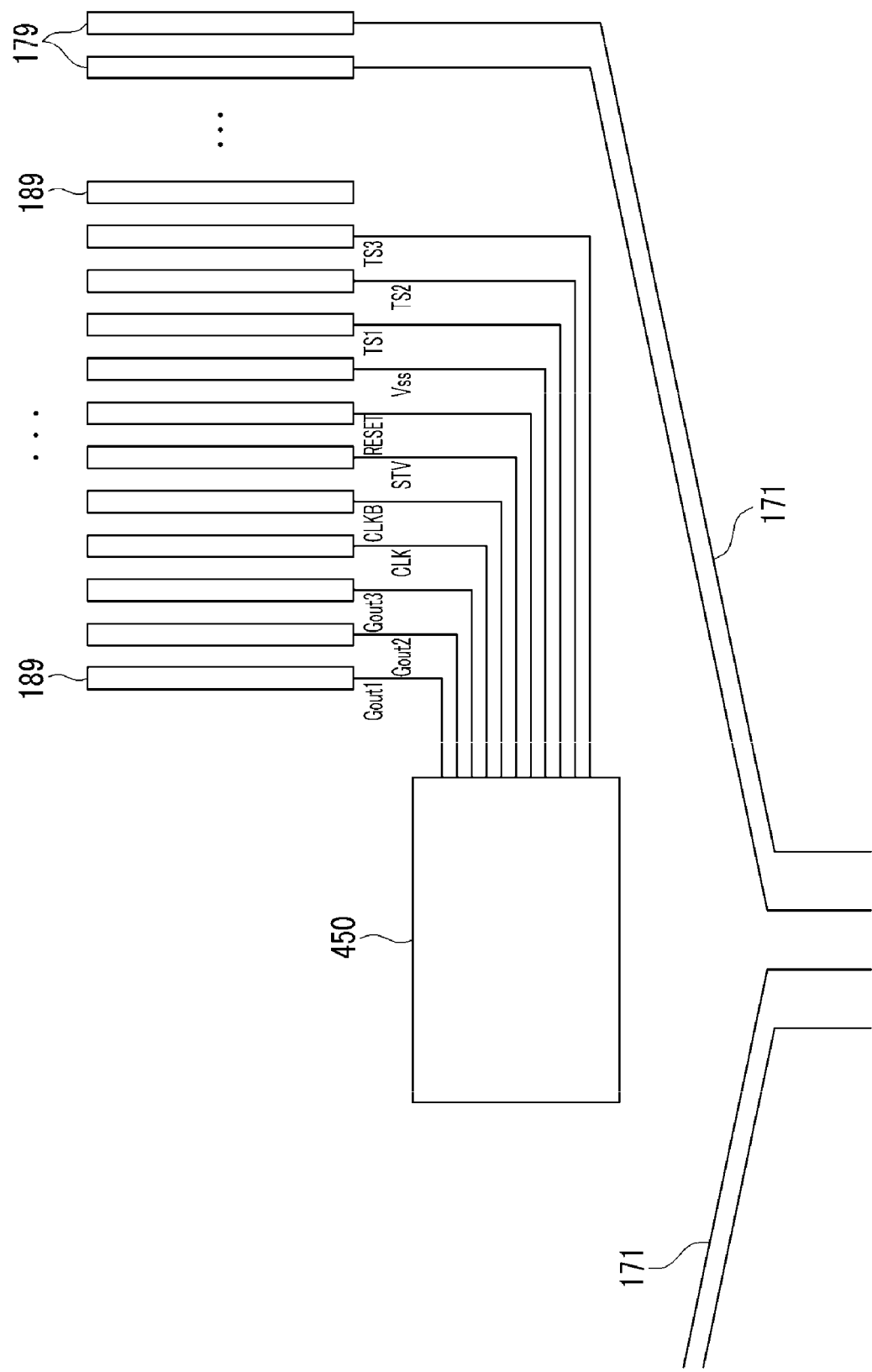

THIN FILM TRANSISTOR ARRAY PANEL HAVING A DRIVER INSPECTION UNIT AND DISPLAY DEVICE INCLUDING THE SAME

CROSS REFERENCE TO RELATED APPLICATION

This application claims priority from and the benefit of Korean Patent Application No. 10-2009-0043719, filed on May 19, 2009, which is hereby incorporated by reference for all purposes as if fully set forth herein.

BACKGROUND OF THE INVENTION

1. Field of the Invention

Exemplary embodiments of the present invention relate to a thin film transistor array panel and a display device including the same.

2. Discussion of the Background

A flat display device such as a liquid crystal display or an organic light emitting is diode display includes a display panel. The display panel may include pixels having switching elements, display signal lines, and a gate driver that supplies gate signals to gate lines of the display signal lines so as to turn on/off the switching elements of the pixels. The display panel may also include a data driver for applying data voltages to data lines of the display signal lines, and a signal controller for controlling the above elements.

The gate driver and the data driver may be mounted on the flat display device as one or more IC chip type devices, they may be mounted on a flexible printed circuit film as a tape carrier package (TCP) type device and attached to the flat display device, or they may be mounted on a printed circuit board (PCB). Particularly, the gate driver may be integrated in the display panel by forming it during the same forming process as the display signal lines and the switching elements forming process.

When the gate driver is integrated in the display panel, the gate driver includes a plurality of transistors that include amorphous silicon. Thus, a change in the characteristics of the transistors may be generated due to an abnormality in the manufacturing process of the display device. Particularly, although a transistor may operate normally at room temperature, the transistor may operate abnormally in a limit condition such as in a high temperature or low temperature condition. If a reliability inspection for consistency across a temperature range of the amorphous silicon transistor is executed after completing the display device, manufacturing productivity may be sacrificed.

The above information disclosed in this Background section is only for enhancement of understanding of the background of the invention and therefore it may contain information that does not form any part of the prior art.

SUMMARY OF THE INVENTION

Exemplary embodiments of the present invention provide a thin film transistor array panel having a driver inspection unit to detect anomalies in the transistors of a gate driver.

Exemplary embodiments of the present invention also provide a display device having a thin film transistor array panel with a driver inspection unit to detect anomalies in the transistors of the gate driver.

Additional features of the invention will be set forth in the description which follows, and in part will be apparent from the description, or may be learned by practice of the invention.

An exemplary embodiment of the present invention discloses a thin film transistor array panel including a plurality of gate lines. A plurality of pixels is respectively connected to the gate lines. The thin film transistor array panel also includes a gate driver comprising a plurality of stages connected to each other. The plurality of stages is respectively connected to the plurality of gate lines to apply gate signals to the plurality of gate lines. The thin film transistor array panel also includes a driver inspection unit separated from the gate driver and including at least three inspection stages. Each of the at least three inspection stages has the same structure as one of the plurality of stages of the gate driver.

An exemplary embodiment of the present invention also discloses a display device including a plurality of gate lines and a plurality of data lines. A plurality of pixels is respectively connected to the gate lines and the data lines. The display device also includes a gate driver comprising a plurality of stages connected to each other. The plurality of stages is respectively connected to the plurality of gate lines to apply gate signals to the plurality of gate lines. The display device also includes a driver inspection unit separated from the gate driver and including at least three inspection stages. The display device also includes a data driver connected to the plurality of data lines. Each of the at least three inspection stages has the same structure as one of the plurality of stages of the gate driver.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 4 is a circuit diagram of the first stage of the driver inspection unit shown in

FIG. 3.

FIG. 5 is a layout view showing a driver inspection unit according to an exemplary embodiment of the present invention and a signal line connected thereto.

DETAILED DESCRIPTION OF THE ILLUSTRATED EMBODIMENTS

Figure 1:
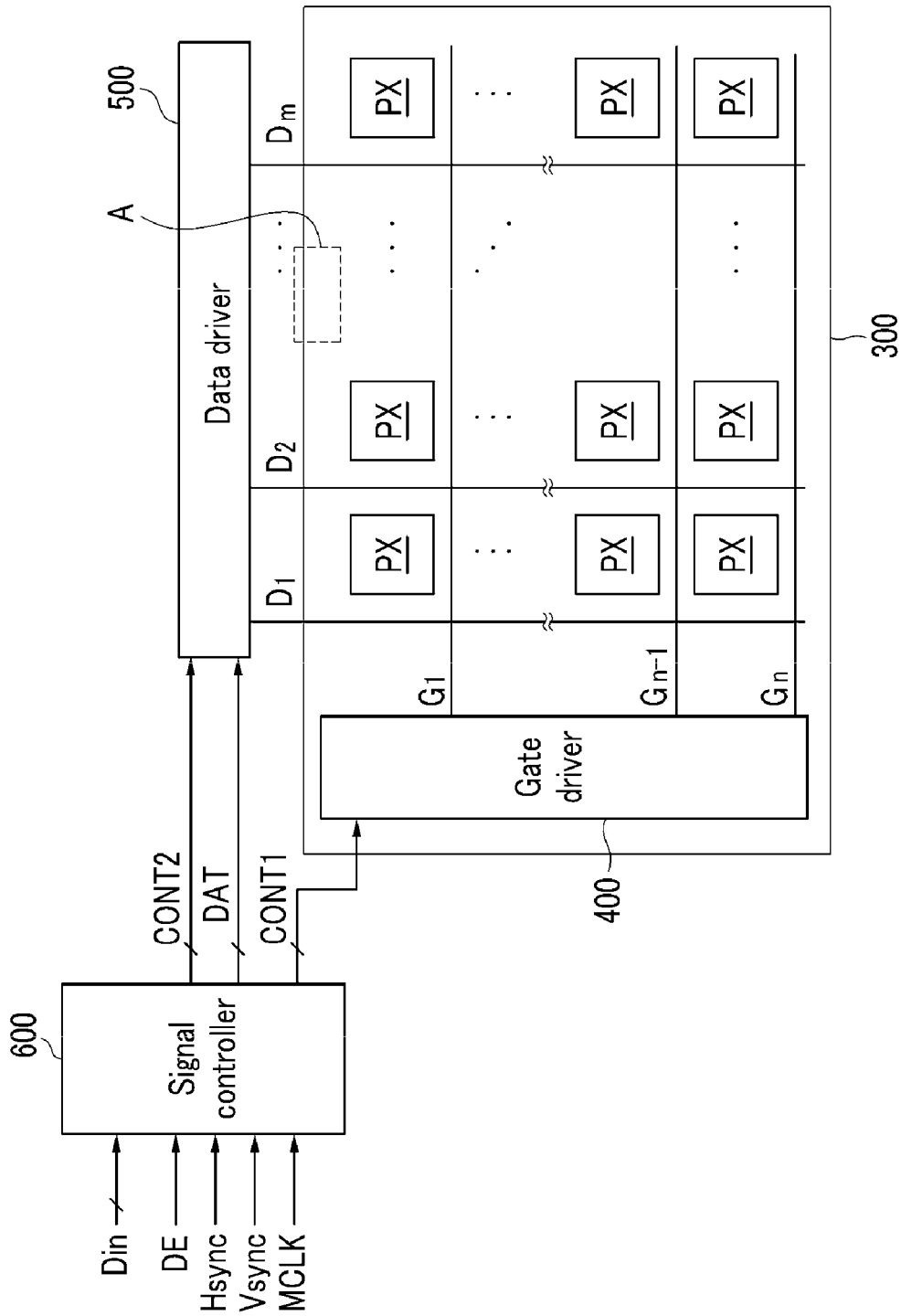
FIG. 1 is a block diagram of a display device according to an exemplary embodiment of the present invention.

The present invention will be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may also be present. In contrast, when an element is referred to as being "directly on" or "directly connected to" another element or layer, there are no intervening elements or layers present.

Firstly, a display device according to an exemplary embodiment of the present invention will be described with reference to FIG. 1.

FIG. 1 is a block diagram of a display device according to an exemplary embodiment of the present invention.

Referring to FIG. 1, a display device according to an exemplary embodiment of the present invention includes a thin film transistor array panel 300, a gate driver 400 and a data driver 500 connected thereto, and a signal controller 600 controlling them.

As shown in FIG. 1, in an equivalent circuit of the thin film transistor array panel 300, the thin film transistor array panel 300 includes a plurality of signal lines $G_1$-$G_n$ and $D_1$-$D_m$, and a plurality of pixels PX arranged in an approximate matrix.

The signal lines $G_1$-$G_n$ and $D_1$-$D_m$ include a plurality of gate lines G1 to Gn for is transmitting gate signals (also referred to as "scanning signals") and a plurality of data lines D1 to Dm for transmitting data voltages. The gate lines G1 to Gn are arranged substantially parallel to each other and extend substantially in a row direction. The data lines D1 to Dm are arranged substantially parallel to each other and extend substantially in a column direction.

Each pixel PX includes a switching element (not shown). Each switching element is respectively connected to corresponding signal lines $G_1$-$G_n$ and $D_1$-$D_m$.

The gate driver 400 is connected to the gate lines G1 to Gn, and applies gate signals obtained by combining a gate-on voltage Von and a gate-off voltage Voff to the gate lines G1 to Gn. The gate driver 400 is substantially a shift register that includes a plurality of stages respectively connected to the gate lines, and it may be formed in the same process as the switching elements of the pixels PX thereby being integrated on the thin film transistor array panel 300. However, the gate driver 400 may be mounted on the thin film transistor array panel 300 as an integrated circuit (IC) chip type device.

The data driver 500 is connected to the data lines $D_1$-$D_m$ of the thin film transistor array panel 300, and applies the data signal to the data lines $D_1$-$D_m$.

The signal controller 600 controls the gate driver 400 and the data driver 500.

Each of the data driver 500 and the signal controller 600 may be installed directly on the thin film transistor array panel 300 in the form of at least one IC chip. Alternatively, each of the drivers 500 and 600 may be installed on a flexible printed circuit film (not shown) to be attached to the thin film transistor array panel 300 in the form of a tape carrier package (TCP) or installed on a separate printed circuit board (not shown). According to another embodiment, they may be directly integrated on the thin film transistor array panel 300 along with the signal lines $G_1$-$G_n$ and $D_1$-$D_m$, and the switching elements, like the gate driver 300. Furthermore, all is the driving devices 500 and 600 may be integrated into a single IC chip, but at least one of the driving devices 500 and 600 or at least one circuit element in at least one of the driving devices 500 and 600 may be disposed outside of the single IC chip.

Now, the operation of the above-described display device will be described in detail.

The signal controller 600 is supplied with input image signals $D_{in}$ and input control signals for controlling the display thereof from an external graphics controller (not shown). The input control signals include a vertical synchronization signal Vsync, a horizontal synchronization signal Hsync, a main clock signal MCLK, and a data enable signal DE.

On the basis of the input control signals and the input image signals $D_{in}$, the signal controller 600 generates gate control signals CONT1 and data control signals CONT2 and processes the image signals Din to be suitable for the operation of the thin film transistor array panel 300. The signal controller 600 sends the gate control signals CONT1 to the gate driver 400 and sends the processed image signals DAT and the data control signals CONT2 to the data driver 500.

The gate control signals CONT1 include a scanning start signal STV for instructing the gate driver 400 to start scanning, and at least one clock signal for controlling the output period of the gate-on voltage Von. The gate control signals CONT1 may further include at least one output enable signal OE for defining the duration of the gate-on voltage Von.

The data control signals CONT2 include a horizontal synchronization start signal STH for informing the data driver 500 of a start of transmission of output image signals DAT of one pixel PX row, a load signal LOAD for instructing the data driver 500 to apply the data signals to the data lines $D_1$-$D_m$, and a data clock signal HCLK. The data control signals CONT2 is may further include an inversion signal RVS for reversing the polarity of the voltages of the data signals with respect to the common voltage Vcom (hereinafter, "the polarity of the voltages of the data signals with respect to the common voltage" is abbreviated to "the polarity of the data signals").

Responsive to the data control signals CONT2 from the signal controller 600, the data driver 500 receives the digital image signals DAT for a row of pixels PX, converts the digital image signals DAT into analog data voltages by selecting gray voltages corresponding to the respective digital image signals DAT, and applies the analog data signals to the data lines D1-Dm.

The gate driver 400 applies the gate-on voltage Von to a gate line G1-Gn in response to the scanning control signals CONT1 from the signal controller 600, thereby turning on the switching elements connected thereto. The data signals applied to the data lines D1-Dm are then supplied to the pixels PX through the turned-on switching elements.

By repeating this procedure by a unit of a horizontal period (also referred to as "1H" and that is equal to one period of the horizontal synchronization signal Hsync and the data enable signal DE), all gate lines G1-Gn are sequentially supplied with the gate-on voltage Von, thereby applying the data signals to all pixels PX to display an image for a frame.

When the next frame starts after one frame finishes, the inversion signal RVS applied to the data driver 500 is controlled such that the polarity of the data signals is reversed (which is referred to as "frame inversion"). The inversion signal RVS may also be controlled such that the polarities of the data signals flowing in a data line are periodically reversed during one frame (for example, row inversion and dot inversion), or the polarity of the data signals in one packet are reversed (for example, column inversion and dot inversion).

Next, a driver inspection unit according to an exemplary embodiment of the present invention will be described with reference to FIG. 2, which is an enlarged view of portion "A" of FIG. 1.

Figure 2:
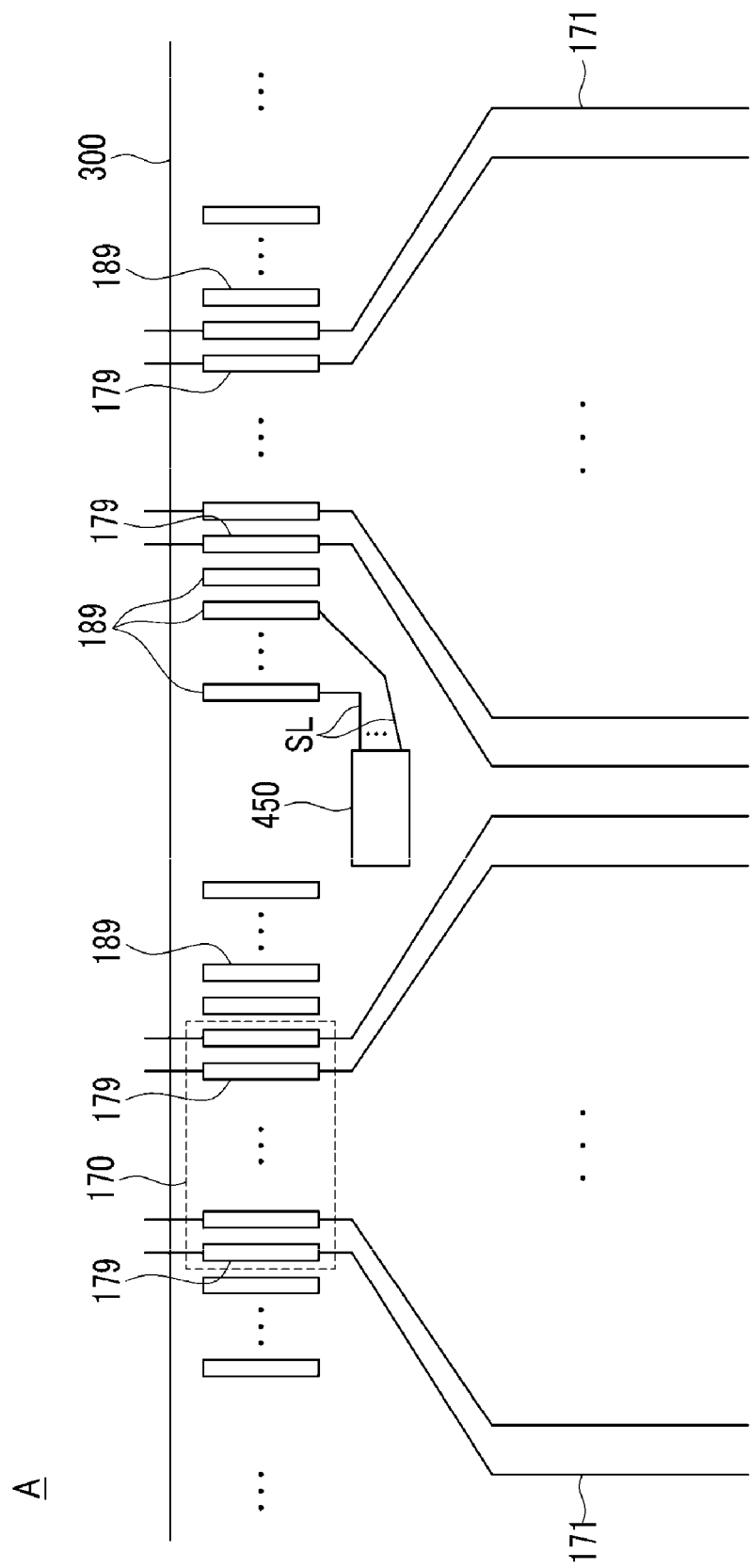
FIG. 2 is an enlarged layout view of portion "A" of FIG. 1.

Referring to FIG. 1 and FIG. 2, a data pad unit 170 including a plurality of data pads 179 connected to the data lines 171, and a plurality of dummy pads 189 separated from the data pad unit 170, and a driver inspection unit 450 connected to at least a portion of the dummy pads 189 through signal lines SL are formed on the thin film transistor array panel 300 near the data driver 500.

The data pads 179 transmit data signals to the respective data lines 171 from the data driver 500. An interval between a plurality of data lines 171 decreases approaching the data pad 179, thereby forming a data line fan-out unit. Each data pad unit 170 corresponds to an IC chip when the data driver 500 is mounted on the thin film transistor array panel 300 as a plurality of IC chips. The data pads 179 are made with the same layer as the data lines 171, forming a respective portion of each data line 171.

The dummy pads 189 are not used in the driving of the display device, and are disposed on a side of the data pads 179. However, differently from FIG. 2, the dummy pads 189 may be disposed between the data pads 179 of the data pad unit 170. The dummy pads 189 may also be formed with the same layer as the data lines 171 and the data pads 179, or may be formed with a different layer.

As shown in FIG. 2, the driver inspection unit 450 may be disposed between the data lines 171 that are respectively connected to two neighboring data pad units 170. However, the driver inspection unit 450 may be disposed on various regions of the edge of the thin film transistor array panel 300. The driver inspection unit 450 is connected to the dummy pads 189 is through the signal lines SL, and receives input signals and outputs test signals through the dummy pads 189.

The driver inspection unit 450 is formed by the same process as the gate driver 400, and includes an inspection stage having the same structure as a portion of the several stages of the gate driver 400.

Next, the driver inspection unit 450 according to an exemplary embodiment of the present invention will be described with reference to FIG. 3, FIG. 4 and FIG. 5.

Figure 3:
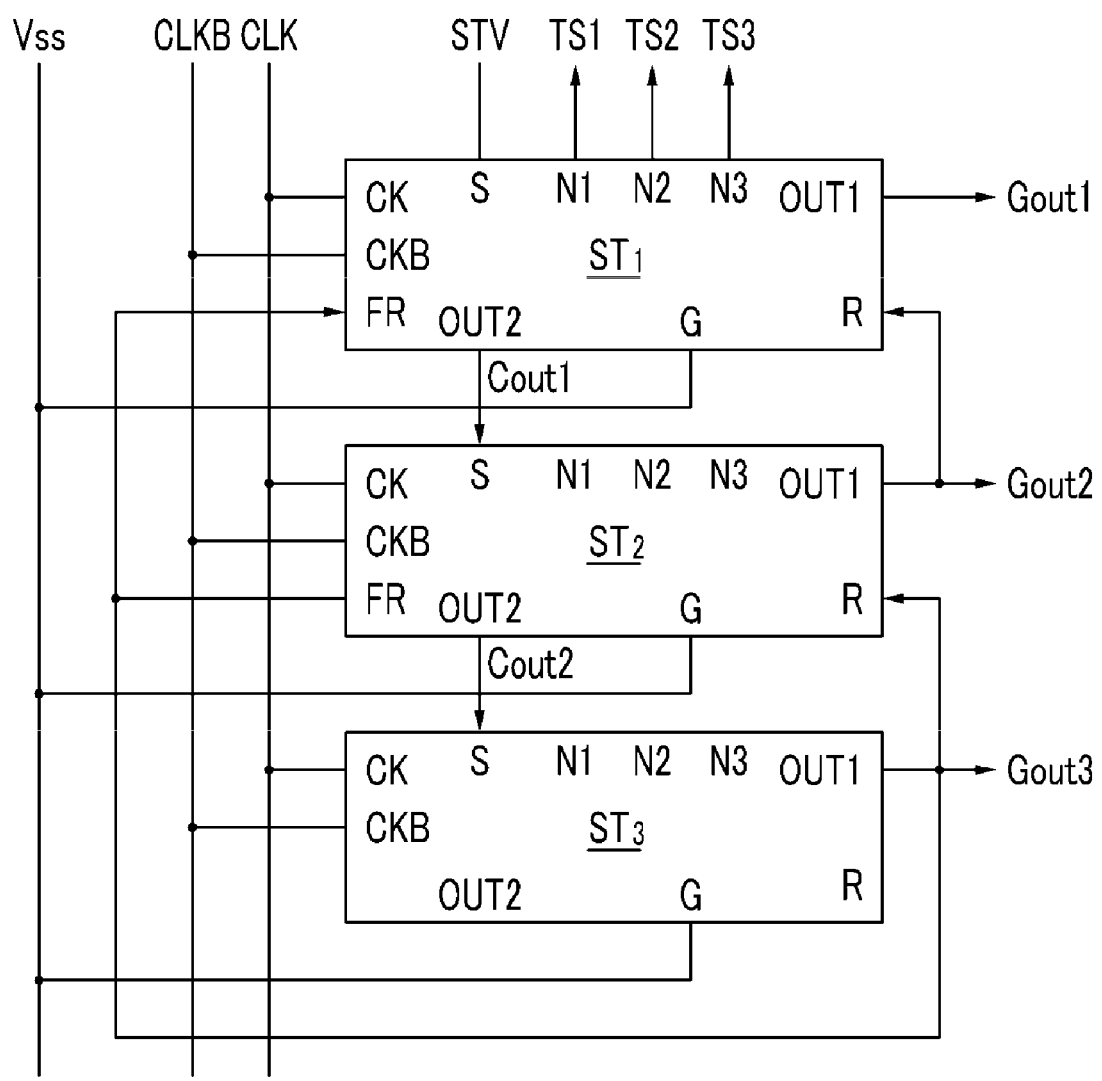
FIG. 3 is a block diagram of a driver inspection unit according to an exemplary embodiment of the present invention.

FIG. 3 is a block diagram of a driver inspection unit according to an exemplary embodiment of the present invention. FIG. 4 is a circuit diagram of the first stage of the driver inspection unit shown in FIG. 3. FIG. 5 is a layout view showing a driver inspection unit according to an exemplary embodiment of the present invention and a signal line connected thereto.

Firstly, referring to FIG. 3 and FIG. 5, the driver inspection unit 450 according to an exemplary embodiment of the present invention receives input of a common voltage Vss, a first clock signal CLK, a second clock signal CLKB, the scanning start signal STV, and a reset signal RESET through the dummy pads 189. In an optional embodiment, the reset signal RESET may be omitted. The first clock signal CLK and the second clock signal CLKB may have a phase difference of 180°, a high level thereof may be a gate-on voltage Von, and a low level thereof may be a gate-off voltage Voff for turning on/off the switching elements.

Referring to FIG. 3, the driver inspection unit 450 includes at least three stages $ST_1$, $ST_2$, and $ST_3$. Each of the stages $ST_1$, $ST_2$, and $ST_3$ has a set terminal S, a common voltage terminal G, two clock terminals CK and CKB, a reset terminal R, a frame reset terminal FR, a gate output terminal OUT1, a carry output terminal OUT2 and at least one of inspection nodes is N1, N2, and N3. However, as shown in FIG. 3, the final inspection stage $ST_3$ may not have the frame reset terminal.

The first clock signal CLK and the second clock signal CLKB are applied to the respective clock terminals CK and CKB of each stage $ST_1$, $ST_2$, and $ST_3$, and the common voltage Vss is applied to the respective common voltage terminals G of each stage $ST_1$, $ST_2$, and $ST_3$. The gate output terminal OUT1 of each stage $ST_1$, $ST_2$, and $ST_3$ outputs the gate outputs Gout1, Gout2, and Gout3, and the carry output terminal OUT2 of the stages $ST_1$ and $ST_2$ outputs carry outputs Cout1 and Cout2. On the other hand, the set terminal S of the first stage $ST_1$ is input with the scanning start signal STV, and the set terminals S of the subsequent stages $ST_2$ and $ST_3$ are input with the carry outputs of the previous stages $ST_1$ and $ST_2$, respectively, that is, the previous carry outputs Cout1 and Cout2, respectively. The reset terminals R of the stages $ST_1$ and $ST_2$ are input with the gate outputs of the following stages $ST_2$ and $ST_3$, respectively, that is, the following gate outputs Gout2 and Gout3, respectively.

Figure 4:
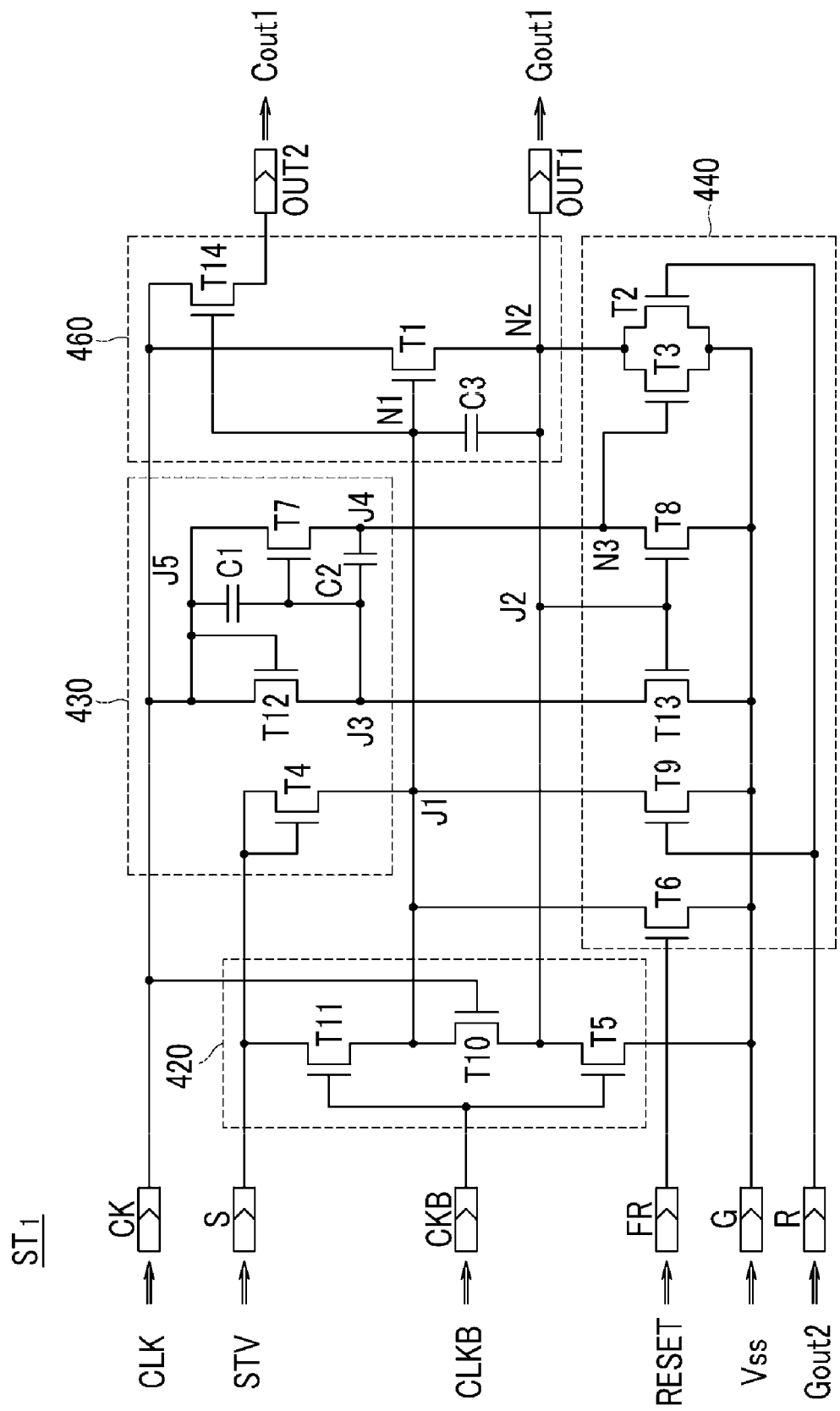

Referring to FIG. 4, the first stage $ST_1$ of the driver inspection unit 450 according to an exemplary embodiment of the present invention includes an input section 420, a pull-up driving unit 430, a pull-down driving unit 440, and an output unit 460. They include at least one of thin film transistors T1-T14, and the pull-up driving unit 430 and the output unit 460 further include capacitors C1, C2 and C3. The thin film transistors T1-T14 may be an NMOS transistor or a PMOS transistor. Further, the capacitors C1, C2 and C3 may have parasitic capacitances between a gate and either a drain or a source formed during a manufacturing process.

The input section 420 includes three transistors T11, T10, and T5 that are sequentially coupled in series to the set terminal S and the common voltage terminal G. The gates of the transistors T11 and T5 are connected to the clock terminal CKB, and the gate of the is transistor T10 is connected to the clock terminal CK. A junction between the transistor T11 and the transistor T10 is connected to a junction J1, and a junction between the transistor T10 and the transistor T5 is connected to a junction J2.

The pull-up driving unit 430 includes a transistor T4 connected between the set terminal S and the junction J1, a transistor T12 connected to the clock terminal CK and a junction J3, and a transistor T7 connected between the clock terminal CK and a junction J4. The gate and drain of the transistor T4 are commonly connected to the set terminal S and the source thereof is connected to the junction J1. The gate and the drain of the transistor T12 are commonly connected to the clock terminal CK and the source thereof is connected to the junction J3. The gate of the transistor T7 is connected to the junction J3 and is simultaneously connected to the clock terminal CK through the capacitor C1, the drain thereof is connected to the clock terminal CK and the source thereof is connected to the junction J4. The capacitor C2 is connected between the junction J3 and the junction J4.

The pull-down driving unit 440 includes a plurality of transistors T6, T9, T13, T8, T3, and T2 receiving the common voltage Vss through their respective sources, and outputting it to the junctions J1, J1, J3, J4, J2 and J2, respectively, through their drains. The gate of the transistor T6 is connected to the frame reset terminal FR, the drain thereof is connected to the junction J1. The gate of the transistor T9 is connected to the reset terminal R, and the drain thereof is connected to the junction J1. The gates of the transistors T13 and T8 are commonly connected to the junction J2 and the drains thereof are respectively connected to the junctions J3 and J4. The gate of the transistor T3 is connected to the junction J4. The gate of the transistor T2 is connected to the reset terminal R, and the drains of the two transistors T3 and T2 are connected to the junction J2.

The output unit 460 includes a pair of transistors T1 and T14 having drains and sources that are respectively connected between the clock terminal CK, and the output terminals OUT1 and OUT2, and respective gates connected to the junction J1. The output unit 460 includes a capacitor C3 connected between the gate and the drain of the transistor T1, that is, between the junction J1 and the junction J2. The source of the transistor T1 is also connected to the junction J2.

On the other hand, the inspection nodes N1, N2, and N3 are junctions for detecting the signals at each of the stages $ST_1$, $ST_2$, and $ST_3$, and may be selected from among the several junctions J1, J2, J3, J4, and J5 shown in FIG. 4. For example, as shown in FIG. 3 and FIG. 4, the node N1 connected to the gate of the transistor T1, the node N2 connected to the drain of the transistor T1, or the node N3 connected to the drain of the transistor T8 may be connected to the test signal line, thereby selecting and detecting the test signal TS1, TS2, and TS3 at each node N1, N2, and N3, respectively. As shown in FIG. 5, these test signals TS1, TS2, and TS3, and the gate outputs Gout1, Gout2, and Gout3 may be detected through the corresponding dummy pad 189 connected to the corresponding signal line SL.

The middle stage $ST_2$ and the final stage $ST_3$ have similar structures to the first stage ST1.

Differently from FIG. 3, the driver inspection unit 450 may include more than three inspection stages, and in this case, the first and final inspection stages may have the same structures as the first and final inspection stages $ST_1$ and $ST_3$ shown in FIG. 3, and the remaining intermediate inspection stages may have the same structure as the middle inspection stage $ST_2$ shown in FIG. 3.

As described above, the driver inspection unit 450 is formed through the same is process as the gate driver 400, and receives the several signals through the dummy pads 189 such that the driver inspection unit 450 is operated equally to the gate driver 400. Accordingly, the signals of the junctions N1, N2, and N3 and the gate output terminal OUT1 of the driver inspection unit 450 may be inspected in any step of the manufacturing process of the display device as well as after the completion of manufacturing of the display device such that the characteristics and problems of the gate driver 400 are easily measured and inspected. Particularly, when a process anomaly is generated in a manufacturing process such that the characteristics of the transistors included in the driver inspection unit 450 as well as the gate driver 400 are changed, the reliability of the transistors according to a change of temperature may be easily detected.

According to an exemplary embodiment of the present invention, signals of several junctions and a gate output terminal of a driver inspection unit that is formed in the same process as the gate driver may be inspected such that characteristics and any defects in the gate driver may be easily detected in any step of the manufacturing process.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A thin film transistor array panel, comprising:
a plurality of gate lines;
a plurality of pixels respectively connected to the gate lines;
a plurality of data lines respectively connected to the plurality of pixels;
a gate driver comprising a plurality of stages connected to each other, the plurality of stages being respectively connected to the plurality of gate lines to apply gate signals to the plurality of gate lines; and
a driver inspection unit separated from the gate driver and comprising at least three inspection stages that are not connected to any gate lines,
wherein each of the at least three inspection stages has the same structure as one of the plurality of stages of the gate driver, and the driver inspection unit is disposed between two data lines which are respectively connected to two neighboring data driving circuits among a plurality of data driving circuits.

2. The thin film transistor array panel of claim 1, wherein the gate driver and the driver inspection unit are integrated on the thin film transistor array panel.

3. The thin film transistor array panel of claim 2, further comprising:
a plurality of data pads respectively connected to the plurality of data lines; and
a plurality of dummy pads separated from the plurality of data pads,
wherein the driver inspection unit is connected to at least one of the plurality of dummy pads.

4. The thin film transistor array panel of claim 3, wherein each of the inspection stages comprises a driving circuit comprising a plurality of transistors and a plurality of junctions between the transistors,
the thin film transistor array panel further comprises a test signal line to detect a signal of at least one of the plurality of junctions, and
the test signal line is connected to one of the plurality of dummy pads.

5. The thin film transistor array panel of claim 1, further comprising:
a plurality of data pads respectively connected to the plurality of data lines, and
a plurality of dummy pads separated from the plurality of data pads,
wherein the driver inspection unit is connected to at least one of the plurality of dummy pads.

6. The thin film transistor array panel of claim 5, wherein each of the inspection stages comprises a driving circuit comprising a plurality of transistors and a plurality of junctions between the transistors,
the thin film transistor array panel further comprises a test signal line to detect a signal of at least one of the plurality of junctions, and
the test signal line is connected to one of the plurality of dummy pads.

7. The thin film transistor array panel of claim 1, wherein each of the inspection stages comprises a driving circuit comprising a plurality of transistors and a plurality of junctions between the transistors, and
the thin film transistor array panel further comprises a test signal line to detect a signal of at least one of the plurality of junctions.

8. A display device, comprising:
a plurality of gate lines and a plurality of data lines;
a plurality of pixels respectively connected to the gate lines and connected to the data lines;
a gate driver comprising a plurality of stages connected to each other, the plurality of stages being respectively connected to the plurality of gate lines and to apply gate signals to the plurality of gate lines,
a driver inspection unit separated from the gate driver and comprising at least three inspection stages that are not connected to any gate lines; and
a data driver connected to the plurality of data lines, the data driver comprising a plurality of data driving circuits,
wherein each of the at least three inspection stages has the same structure as one of the plurality of stages of the gate driver, and the driver inspection unit is disposed between two data lines which are respectively connected to two neighboring data driving circuits among the plurality of data driving circuits.

9. The display device of claim 8, wherein
the gate driver and the driver inspection unit are integrated on a thin film transistor array panel.

10. The display device of claim 9, wherein
the data driver comprises a plurality of data driving circuits,
the display device further comprises a plurality of dummy pads separated from the data pads, and the driver inspection unit is connected to at least one of the plurality of dummy pads.

11. The display device of claim 10, wherein
each of the inspection stages comprises a driving circuit comprising a plurality of transistors and a plurality of junctions between the transistors,
the display device further comprises a test signal line to detect a signal of at least one of the plurality of junctions, and
the test signal line is connected to one of the plurality of dummy pads.

12. The display device of claim 8, wherein
the display device further comprises a plurality of dummy pads separated from the data pads, and the driver inspection unit is connected to at least one of the plurality of dummy pads.

13. The display device of claim 12, wherein
each of the inspection stages comprises a driving circuit comprising a plurality of transistors and a plurality of junctions between the transistors,
the display device further comprises a test signal line to detect a signal of at least one of the plurality of junctions, and
the test signal line is connected to one of the plurality of dummy pads.

14. The display device of claim 8, wherein
each of the inspection stages comprises a driving circuit comprising a plurality of transistors and a plurality of junctions between the transistors,
the display device further comprises a test signal line to detect a signal of at least one of the plurality of junctions.

15. A display device, comprising:
a plurality of gate lines and a plurality of data lines;
a plurality of pixels respectively connected to the gate lines and connected to the data lines;
a gate driver comprising a plurality of stages connected to each other, the plurality of stages being respectively connected to the plurality of gate lines and to apply gate signals to the plurality of gate lines,
a driver inspection unit separated from the gate driver; and
a data driver connected to the plurality of data lines,
wherein the driver inspection unit is disposed between two data lines which are respectively connected to two neighboring data driving circuits among a plurality of data driving circuits, the driver inspection unit being connected to at least one of a plurality of dummy pads.

* * * * *